United States Patent
Jeng et al.

(10) Patent No.: US 6,451,161 B1
(45) Date of Patent: Sep. 17, 2002

(54) METHOD AND APPARATUS FOR GENERATING HIGH-DENSITY UNIFORM PLASMA

(75) Inventors: David Guang-Kai Jeng, Hsinchu (TW); Hong-Ji Lee, Hsinchu (TW); Fred Yingyi Chen, Hsinchu (TW); Ching-An Chen, Hsinchu (TW); Tsung-Nane Kuo, Hsinchu (TW); Jui-Hung Yeh, Hsinchu (TW)

(73) Assignee: Nano-Architect Research Corporation, Hsinchu (TW)

( * ) Notice: Subject to any disclaimer, the term of this patent is extended or adjusted under 35 U.S.C. 154(b) by 0 days.

(21) Appl. No.: 09/546,689

(22) Filed: Apr. 10, 2000

(51) Int. Cl.⁷ .................................................. C23F 1/00
(52) U.S. Cl. ............................ 156/345.48; 156/345.33; 118/723 I
(58) Field of Search ........................ 118/723 AN, 723 I, 118/723 MP, 723 R, 728; 315/111.21, 111.31, 111.41, 111.51; 219/121.4, 121.43, 121.48, 121.52, 121.54, 385

(56) References Cited

U.S. PATENT DOCUMENTS

| | | | | |
|---|---|---|---|---|
| 5,277,751 A | * | 1/1994 | Ogle | 216/70 |
| 5,280,154 A | * | 1/1994 | Cuomo et al. | 219/121.52 |
| 5,907,221 A | | 5/1999 | Sato et al. | 118/723 MP |
| 6,028,285 A | * | 2/2000 | Khater et al. | 219/121.43 |
| 6,095,083 A | * | 8/2000 | Rice et al. | 118/723 I |
| 6,095,084 A | * | 8/2000 | Ogle | 118/723 E |
| 6,230,651 B1 | * | 5/2001 | Ni et al. | 118/723 I |
| 6,237,526 B1 | * | 5/2001 | Brcka | 118/723 I |

FOREIGN PATENT DOCUMENTS

| | | | | |
|---|---|---|---|---|
| JP | 10-233297 | * | 9/1998 | C23C/16/50 |
| JP | 11-238597 | * | 8/1999 | C23C/14/40 |

OTHER PUBLICATIONS

Yaoxi Wu, et al. "A traveling wave–driven, inductively coupled large area plasma source", Applied Physics Letters, 72(7), 2.16.98, pp. 777–779.*

* cited by examiner

Primary Examiner—Gregory Mills
Assistant Examiner—Rudy Zervigon
(74) Attorney, Agent, or Firm—Bacon & Thomas

(57) ABSTRACT

A method and a reactor of plasma treating a wafer with high induction plasma density and high uniformity of reactive species were disclosed in this invention. The inductively coupled plasma reactor of the present invention includes a vacuum chamber having a dielectric ceiling thereof and a unique coil configuration atop on the dielectric ceiling, wherein the dielectric ceiling is designed to have a different height according to its shape, e.g., a planar, dish-shaped or hat-shaped dielectric ceiling, for coupling an RF power into the chamber to excite the plasma. The unique coil configuration contains plural helical coils which are arranged in series or in parallel to provide a high-density uniform ion plasma for a large wafer treatment.

21 Claims, 6 Drawing Sheets

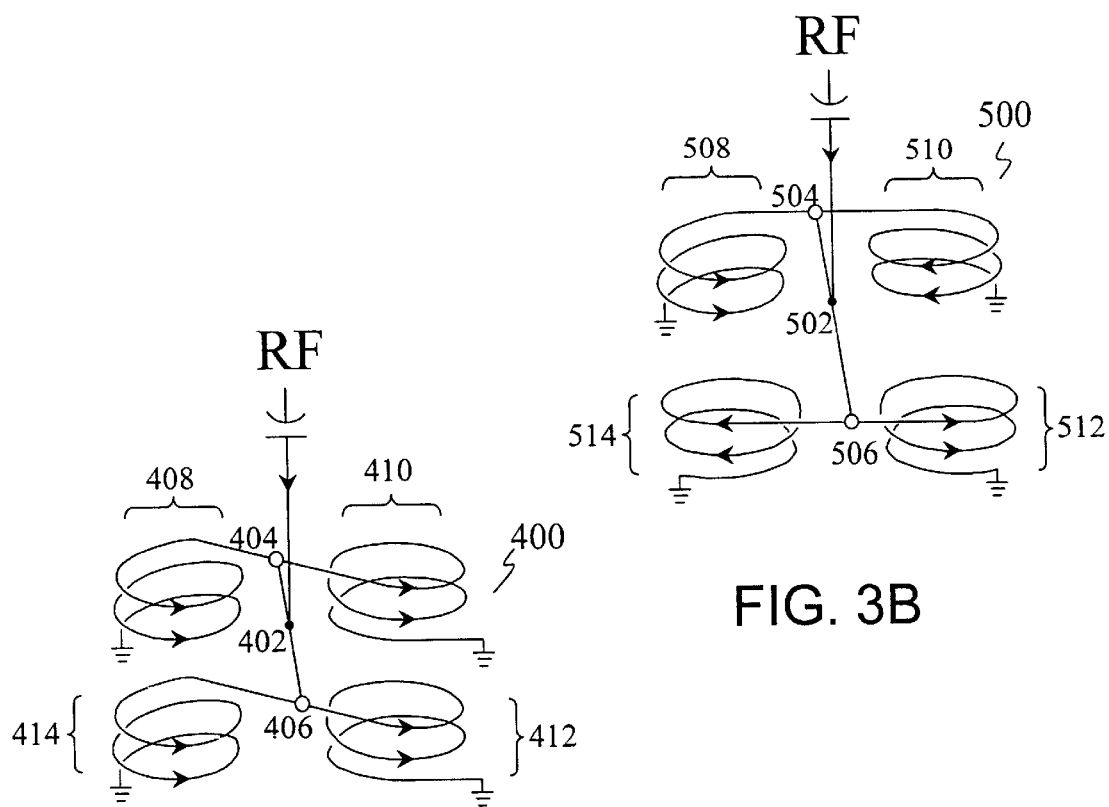
FIG. 3B
FIG. 3A
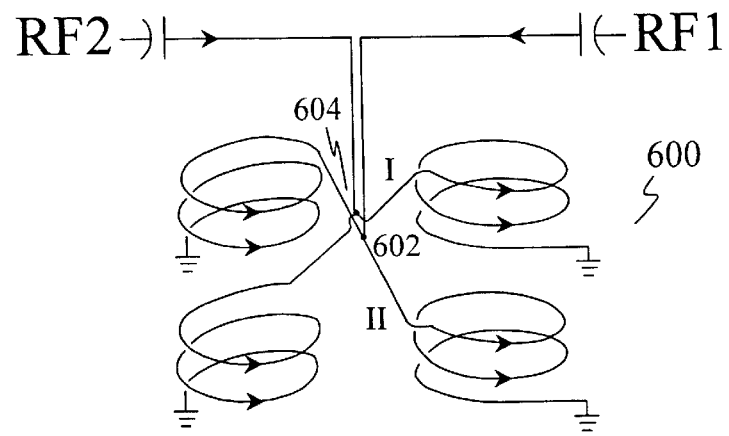
FIG. 3C

METHOD AND APPARATUS FOR GENERATING HIGH-DENSITY UNIFORM PLASMA

FIELD OF THE INVENTION

The invention relates to a plasma reactor and particularly to such a reactor consisting of a unique configuration of plural induction coils atop an adjustable dielectric ceiling for producing a dense uniform plasma and a high etch rate over a large substrate.

BACKGROUND ART

Plasma-enhanced semiconductor processes for etching, deposition, resist stripped, passivation, or the like are well known. Generally, plasma may be produced from a low-pressure process gas by inducing an electron flow which ionizes individual gas molecules through the transfer of kinetic energy through individual electron-gas molecule collisions. Most commonly, the electrons are accelerated in an electric field, such as a radiofrequency (RF) electric field. Various structures have been developed to supply RF fields from devices outside of a vacuum chamber of a plasma reactor to excite a gas therein to a plasma state. Inductively coupled plasma (ICP) caused by coil is one kind of such devices. One conventional apparatus is described by Jacob et al. in U.S. Pat. No. 3,705,091, in which the plasma is generated inside a low pressure cylindrical vessel within the helical coil which is energized by 13 MHz RF radiation. This apparatus has serious contamination due to sputtering of the dielectric vessel walls caused by capacitive coupling created by the RF potentials on the coil with the vessel walls.

In U.S. Pat. No. 4,948,458, Ogle et al. describe a plasma generated at a low pressure such as 0.1 milliTorr to 5 Torr by using a spiral coil positioned on or adjacent to a planar dielectric called a window. The coil is responsive to an RF source having a frequency in the range of 1 to 100 MHz (typically 13.56 MHz), and is coupled to the RF source with an impedance matching network. According to the disclosure in U.S. Pat. No. 5,619,103, the extra dielectric acts as a means to reduce the effects of capacitive coupling between the coil and the plasma.

ICP offers many processing advantages including high densities of reactive species, high process rates, as well as low and controllable sheath voltage. To produce an RF inductively coupled plasma, the coil inductor is adjacent to the chamber. However, plasma generated by such induction plasma sources, no matter what the shape (spiral or helical) of the coil is, may have significant plasma density distribution nonuniformity. One of the causes of non-uniform plasma ion distribution is the coil geometry and location. Another cause is the shape of the plasma itself, which is mainly determined by the shape of the reactor chamber.

In U.S. Pat. No. 5,614,055, Fairbairn et al. disclose a dome-shaped plasma reactor to improve the plasma generation uniformity of a oxygen gas by increasing the height of the coil antenna above the wafer treated. U.S. Pat. No. 5,556,521 discloses a sputter etching apparatus having a dome-shaped dielectric extending into the processing chamber toward a substrate, in which a contoured inductive coil is disposed on the dielectric so as to generate dense uniform plasma for a uniform etch rate at low pressure about 1 milliTorr.

Hanawa et al. in U.S. Pat. No. 5,753,044 describe a dome-shaped reactor like that taught by Fairbairn et al.. This reactor includes specially designed dual coils to produce uniform plasma. The coil antenna is consisted of two portions winding adjacent to the chamber. One cylindrically surrounds the side wall of the reactor chamber, and the other having a shape of a flat disc is disposed upon the dome-shaped ceiling of the reactor chamber. The plasma generated can be adjusted to an optimal uniformity by changing the location and the shape of these two coil portions.

Recently, ICP processing has approached to a large substrate surface area such as 300 mm of wafer, flat panel display wafer or substrate (including glass substrate), and liquid crystal display substrate, etc. However, as a plasma processing chamber gets larger, a nonuniformity in plasma will unavoidable occur and a more dense plasma is also required. For a single coil system, the coil size, diameter, and the number of turns may be increased to achieve these goals. A major obstacle in achieving these goals is the increased-impedance resulting from a larger size coil, which must match the resonance frequency thereof. The inductance of a coil is proportional to the square of its diameter and the number of turns. The resonance condition of a coil is $\omega^2 = 1LC$, where $\omega$: resonance frequency, L: inductance, C: capacitance. To satisfy the resonance condition at a certain frequency, when the inductance, L, increases by a factor, the capacitance, C, has to be decreased by the same factor accordingly. Taking a helical coil having 8" 4-turn diameter being upgraded to 12" 6-turn diameter as an example, the inductance would be increased by the factor of $(12/8)^2 \times (6/4)^2 = 5.0625$. The capacitance will have to be decreased by the same factor. Unfortunately, there is no variable capacitor available that can be operated in a low capacitance region for a typical high-density plasma condition in standard ISM (Industry, Scientific, Medical) frequency bands, such as 13.56 MHz. A solution for current manufacturers is to avoid using standard ISM bands; instead a nonstandard band, e.g., 2 MHz is selected. However, two negative consequences become obvious. First, radio communication interference and disturbance can become a disastrous issue. Second, plasma efficiency decreases as frequency decreases, which is not desirable. This challenge can be overcome by using a plural RF inductors system.

In U.S. Pat. No. 5,669,975 Ashtiani et al. disclose an apparatus for processing a surface of an article with a substantially planar induction coil. The induction coil has two spiral portions which are symmetrically formed a continuous S-shape. The shape of the induction coil helps minimizing the capacitive coupling between the induction coil and the plasma, and further improves plasma uniformity across the surface of wafer, and, in particular, semiconductor substrates having large surface areas.

In U.S. Pat. No. 5,907,221 Sato et al. disclose an inductively coupled plasma reactor having, plural inductive coil loops for processing a substrate. These coil loops are electrically separated from one another and independently connected to separately controllable plasma source RF supplies. The RF power level in each independent coil loop is separately programmed and instantly changeable, thus providing a perfectly uniform plasma ion density distribution across the entire large substrate surface.

SUMMARY OF THE INVENTION

It is, therefore, an object of the present invention to provide a new and improved RF field excited plasma reactor comprising a tailor-made inductance by configuring multiple inductors in series, or in parallel, or the combination of both that could perfectly match and produce a uniform high-density plasma at low pressure over semiconductor substrates having large surface areas.

It is another object of the present invention to provide an improved uniformity in a high-density plasma across a material having a large area in such reactor.

It is still another object of the present invention to provide a unique induction coil configuration which will reduce capacitive coupling between plasma and such induction coil in order to minimize the amount of damaged devices which may occur during plasma processing.

It is a further object of the present invention that the reaction space between the coil configuration and wafer in the reactor chamber is changeable according to the shape of the dielectric window of the reactor chamber, thus providing optimal plasma ion distribution and plasma power.

Accordingly, for accomplishing these objects of the present invention, a unique induction coil configuration atop a dielectric window for exciting gases in a RF vacuum plasma reactor is disclosed.

In accordance with another aspect of the present invention, an inductively coupled plasma reactor comprises a dielectric window having a planar base and an integrally formed upright wall surrounding the planar base.

In accordance with still another aspect of the present invention, the induction coil configuration is put into a dish-shaped dielectric window to prompt an RF plasma species closer to the wafer surface at a low pressure (0.01 milliTorr to 10 milliTorr), thus providing higher plasma power and higher etch rate.

In accordance with yet another aspect of the present invention, a hat-shaped dielectric window is used to replace the dish-shaped dielectric window. This modification is one skill to raise the dielectric ceiling above the wafer treated for further improving plasma concentration in the reactor chamber under deposition conditions.

In accordance with still another aspect of the present invention, plural dielectric windows are used in the inductively coupled plasma reactor for receiving plural helical coils connected according to the induction coil configuration of the present invention, which have a planar base and an integrally formed upright wall surrounding the planar base, instead of using a single thick large dielectric window, to facilitate easy handling and cleaning treatment, and to provide more effective coupling of the RF field to the plasma. Meanwhile, the gas inlets are designed to fit around the perimeter of the individual dielectric window for producing uniform gas distribution.

An inductively coupled plasma reactor of the present invention comprises:

a chamber comprising a bottom plate, an upright side wall surrounding the bottom, and a flange hermetically connected to a free end of the upright side wall, wherein the flange has an aperture above the bottom plate;

a dielectric window which hermetically seals the aperture of the flange to provide a plasma generation space confined by the dielectric window and the chamber; and n helical coils which are separately and uprightly disposed on the dielectric window with longitudinal axes of the n helical coils being parallel with one another, wherein n is an integer not less than 2; wherein said n helical coils are connected in series with an end of the resulting n helical coils connected in series being grounded and another end thereof being adapted to connect to a RF power source; or said n helical coils are connected in parallel with an end of each of the n helical coils being grounded and another end thereof being connected to a node, wherein said another ends of said n helical coils connected in parallel are connected to m nodes, and said m nodes are adapted to connected to one or more RF power sources, wherein m is an integer less than n and greater than 0.

Another inductively coupled plasma reactor provided in the present invention comprises:

a chamber comprising a bottom plate, an upright side wall surrounding the bottom, and a flange hermetically connected to a free end of the upright side wall, wherein the flange has n apertures above the bottom plate, wherein n is an integer not less than 2;

n dielectric windows which hermetically seals said n apertures of the flange to provide a plasma generation space confined by the dielectric window and the chamber, wherein n is defined as above; and n helical coils which are uprightly disposed on said n dielectric windows with longitudinal axes of the n helical coils being parallel with one another, wherein n is defined as above; wherein said n helical coils are connected in series with an end of the resulting n helical coils connected in series being grounded and another end thereof being adapted to connect to a RF power source; or said n helical coils are connected in parallel with an end of each of the n helical coils being grounded and another end thereof being connected to a node, wherein said another ends of said n helical coils connected in parallel are connected to m nodes, and said m nodes are adapted to connected to one or more RF power sources, wherein m is an integer less than n and greater than 0.

The present invention also provides a method of increasing a flux of ionic species of an inductively coupled plasma generated under a vacuum pressure of 0.001 to 10.0 milliTorr, preferably 0.01 to 10.0 milliTorr, in a vacuum chamber having a fixed upright height between a bottom plate and a ceiling thereof. The method comprises using n dielectric windows (n is an integer not less than 2), as a part of the ceiling, each of which has a planar base and an integrally formed upright wall surrounding the planar base, when the inductively coupled plasma is generated, wherein the n dielectric windows are hermetically connected to the ceiling and so that the planar bases of the n dielectric windows extend into the vacuum chamber, and using n helical coils which are separately and uprightly disposed on said n dielectric windows with longitudinal axes of the n helical coils being parallel with one another, wherein n is defined as above, wherein said n helical coils are connected in series with an end of the resulting n helical coils connected in series being grounded and another end thereof being adapted to connect to a RF power source; or said n helical coils are connected in parallel with an end of each of the n helical coils being grounded and another end thereof being connected to a node, wherein said another ends of said n helical coils connected in parallel are connected to m nodes, and said m nodes are adapted to connected to one or more RF power sources, wherein m is an integer less than n and greater than 0.

The present invention further provides a method of increasing a plasma generation uniformity of an inductively coupled plasma generated under a vacuum pressure higher than 10.0 milliTorr, preferably 10–100 milliTorr, am a vacuum chamber having a fixed upright height between a bottom plate and a ceiling thereof, which comprises using n dielectric windows (n is an integer not less than 2), as a part of the ceiling, each of which has a planar base and an integrally formed upright wall surrounding the planar base, wherein the n dielectric windows are hermetically connected to the ceiling and so that the planar bases of the n dielectric windows protrude from the vacuum chamber, and using n helical coils which are separately and uprightly disposed on said n dielectric windows with longitudinal axes of the n helical coils being parallel with one another, wherein n is defined as above, wherein said n helical coils are connected in series with an end of the resulting n helical coils connected in series being grounded and another end thereof being adapted to connect to a RF power source; or said n helical coils are connected in parallel with an end of each of the n helical coils being grounded and another end thereof being connected to a node, wherein said another ends of said n helical coils connected in parallel are connected to m nodes, and said m nodes are adapted to connected to one or more RF power sources, wherein m is an integer less than n and greater than 0.

Further advantageous embodiments of the invention ensue from the features disclosed in the dependent claims.

BRIEF DESCRIPTION OF THE DRAWINGS

Other objectives, features, and advantages of this invention will become apparent from the following detailed description of the preferred but non-limiting embodiments. The description is made with reference to the accompanying drawings in which:

FIG. 3A shows a coil arrangement including plural coaxial helical coil portions constructed according to the teachings of the present invention, wherein each of the coil portions is connected to a common RF source having currents flowing through them in the same direction.

FIG. 3B shows a coil arrangement including plural coaxial helical coil portions constructed according to the teachings of the present invention, wherein each of the coil portions is connected to a common RF source having currents flowing through two adjacent portions in two opposite directions.

FIG. 3C is a schematic diagram showing a coil configuration constructed according to the teachings of the present invention, wherein two pairs of helical coils are respectively connected to two RF sources.

DETAILED DESCRIPTION OF THE PREFERRED EMBODIMENTS

Figure 1A:
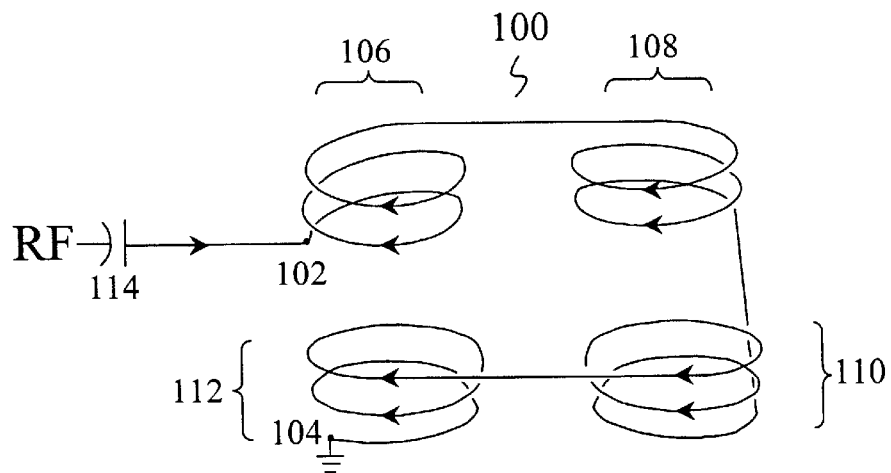
FIG. 1A shows a coil arrangement including plural coaxial helical coil segments having currents flowing through them in the same direction constructed according to the teachings of the present invention.

Referring now to FIG. 1A, a induction coil configuration 100 of the present invention has 4 coaxial helical coils connected in series and thus has two end terminals, 102 and 104. More particularly, the induction coil configuration 100 may be symmetrically wound in series relative to a common cylinder to form four helical coil segments 106, 108, 110, and 112. Preferably, each segment has the same turns, e.g. two turns as shown in FIG. 1A, and the same diameter, e.g. 2 inches. The diameter and number of the turns of the helical coil segments may be modified by taking into consideration of the parameters such as RF power supply, coupling efficiency, induction magnetic flux, induction capacitive effect, and coil characteristics, etc. One is understood that the total length of a coil between two terminals thereof connected to the RF source must be considerably less than one-eighth of the wavelength of the RF source output, and such a result can be achieved by providing a coil configuration with plural helical coil segments according to the present invention. The induction coil configuration 100 is preferably made of a hollow copper tube having a diameter of ⅜ inch through which water is passed for cooling the coil configuration 100 at the same time as the RF power is being transferred therethrough. The coil configuration 100 in FIG. 1A is arranged so that the magnetic fields generated by two adjacent helical coil segments have the same direction, when the end terminal 102 is connected to RF generator via one terminal of an impedance matching circuit 114 and the end terminal 104 is connected to another terminal of the impedance matching circuit 114; i.e., the end terminal 104 being connected to ground. Any two of the four helical coil segments in the coil configuration 100 should be far enough from each other so as to avoid unacceptable dissipation of the RF electromagnetic field generated thereby. Taking a 8-inch wafer as an example, the distance between the axes of the two helical coil segments is about 4 ½ inches. More than one coil configuration 100 can be used together for specific large area processing with a uniform plasma.

Figure 1B:
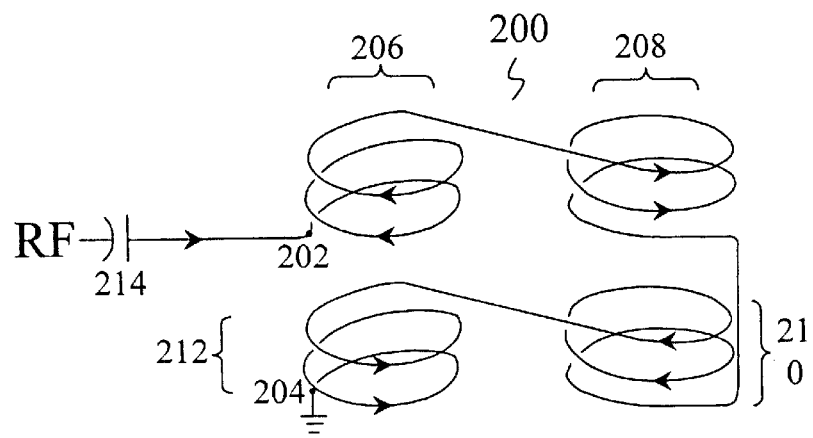
FIG. 1B shows a coil arrangement including plural coaxial helical coil segments having currents flowing through two adjacent segments in two opposite directions constructed according to the teachings of the present invention.
Figure 2:
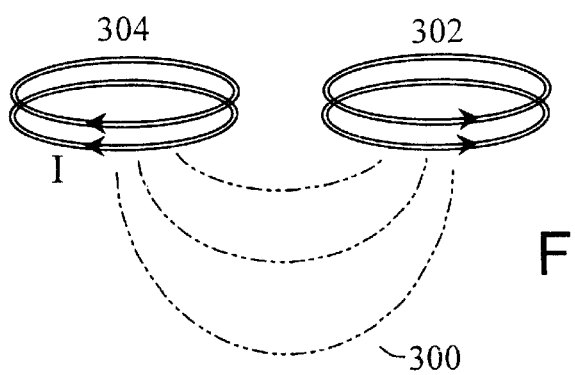
FIG. 2 shows magnetic flux lines produced as a result of excitation of two adjacent coils having currents flowing through them in the opposite directions.

FIG. 1B shows an induction coil configuration similar to that shown in FIG. 1A but with two adjacent segments being oppositely wound. The coil configuration 200 includes 4 helical coil segments 206, 208, 210, and 212 having currents flowing through two adjacent segments in the opposite directions. Consequently, two electric fields generated thereby tend cancel each other out, thus reducing capacitive coupling between the coil configuration and the plasma. As a result of the reduced capacitive coupling, the plasma sheath voltage drop decreases, thus decreasing the number of damaged devices during processing. Furthermore, the RF energy through the four segments in sequence with alternating current directions creates a time-varying magnetic field under the coil segments. FIG. 2 shows an example of the currents flowing in two opposite directions through two adjacent helical coil segments, and there are magnetic flux lines 300 caused by the interaction of magnetic fluxes resulting from the currents flowing in coil segments 302, 304. Similar induction magnetic flux lines could be caused in the coil configuration 200 and a surrounding time-varying magnetic field underneath the coil segments could be formed. The induction time-varying magnetic field is being a driving force to cause cyclotron rotation of the electrons in the plasma, thus increasing the residence time of the electrons in the reactor chamber. An increase in. the residence time of the electrons results in a reduction in the electron loss rate, which in turn provides an increase in the plasma density.

In comparison with FIG. 1A and FIG. 1B, two different coil configurations are shown in FIG. 3A and FIG. 3B, wherein each of the coil portions is in parallel to a common RF source.

Figure 4:
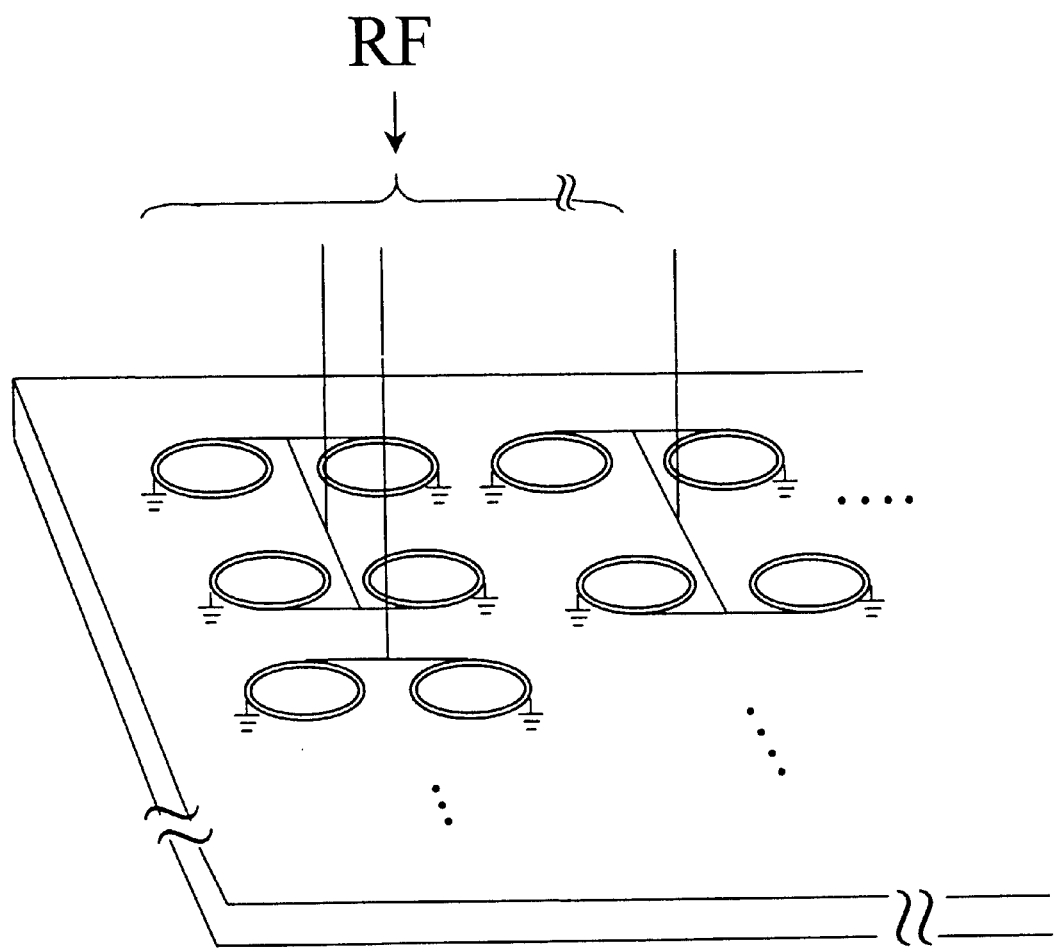
FIG. 4 is a schematic diagram showing a coil configuration constructed according to the teachings of the present invention, wherein a number of coil arrangements are used as required.

With the description of the induction coil configuration 400 in FIG. 3A, the induction coil configuration contains four helical coil portions 408, 410, 412, and 414 and each of them is wound in the same direction. The currents flowing through these four helical coil portions from the RF power through a common node 402 and two next tap points 404 and 406 to the grounded ends are in the same direction. The magnetic fields produced by these four helical coil portions will have the same polarity, and thus a high-densing uniform plasma is induced. More than one coil configuration 400 can be used together for specific large area processing with a uniform plasma across an entire substrate as shown in FIG. 4. Each configuration may have the same or different number of helical coil portions.

Referring to FIG. 3B, a configuration 500 similar to that shown in FIG. 3A but oppositely wound in two adjacent portions is shown. The currents flowing through any two adjacent portions of the four helical coil portions 508, 510, 512 and 514 in the coil configuration 500 from the RF power through a common node 502 and two next tap points 504 and 506 to the grounded ends are in two opposite directions. Compared to FIG 1B, the magnetic field produced by the coil configuration 500 is more effective than the coil configuration 200 in minimizing capacitive coupling between the coil configuration and the plasma. Due to the currents synchronically flow through such four helical coil portions of the coil configuration 500, the net voltage drop that ordinarily occurs across the dielectric plane of plasma reactor will be eliminated. Meanwhile, non-capacitive plasma can be generated, and thus resulting in a lower plasma sheath voltage. The modified coil configuration 500 is appropriate for plasma processing a material (e.g., IC structure) which is sensitive to ion bombardment. As discussed previously, a lower plasma sheath voltage will reduce the number of damaged devices which occurs during processing.

Another RF induced source that can produce a high-density uniform plasma is shown in FIG. 3C, wherein the induction coil configuration 600 consists of two pairs of helical coil portions, I and II, crossing each other. The two pairs are driven by two RF sources separately. The currents flowing through the two pairs of helical coil portions from the two RF sources through two individual common nodes 602 and 604 to the grounded ends are in the same direction. With this connecting scheme, each pair of the helical coil portion can independently generate a magnetic field within the plasma chamber. When the two RF power sources coupled to the two pairs of helical coil portions, I and II, are 180° out of phase, the induced magnetic field will rotate at the frequency of the RF power source. This rotated magnetic field of the particular embodiment shown in FIG. 3C can cause cyclotron rotation of the electrons in the plasma, resulting in a reduction in the electron loss rate, and thus provide an increase in the plasma density and plasma uniformity.

The induction coil configurations 100, 200, 400, 500, and 600 of the present invention can be utilized in the field of plasma processing, and particularly in the fields of etching and deposition on semiconductor wafers.

Figure 5:
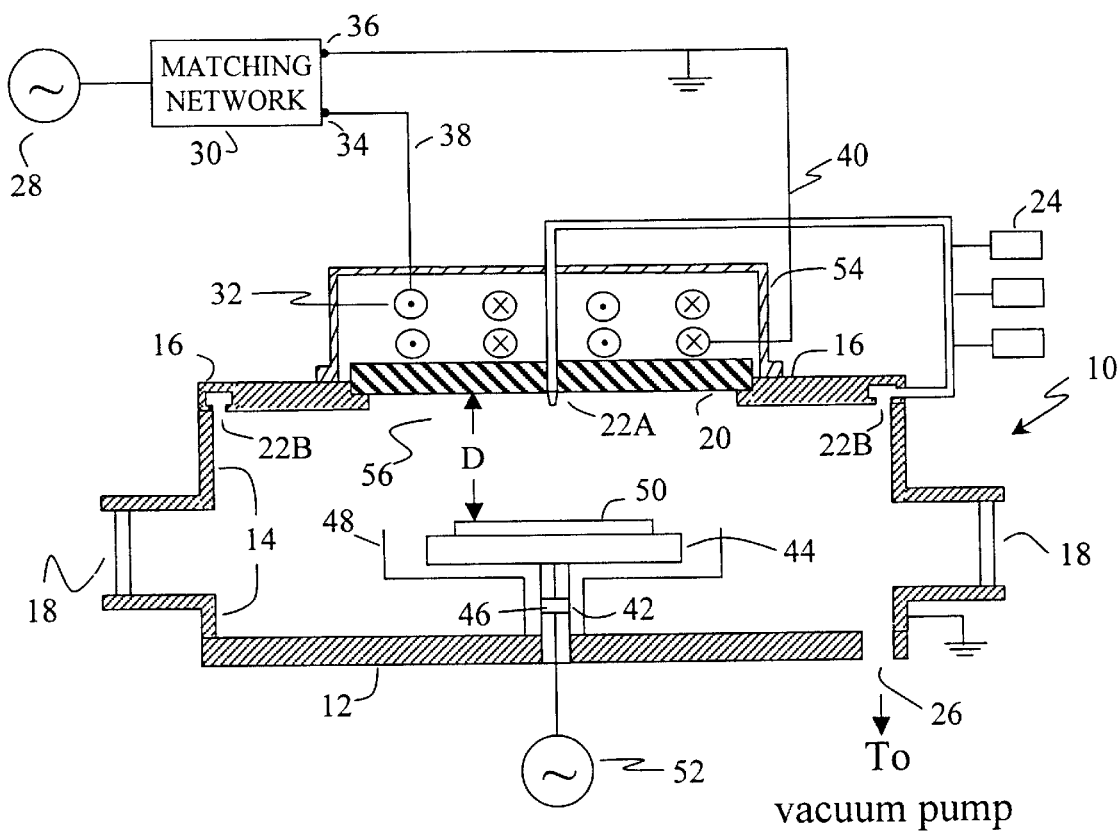
FIG. 5 is a side cross-sectional view of a plasma reactor of the present invention employing a unique configuration of plural helical coils.

Referring now to FIG. 5, a plasma processing system according to the present invention having an induction coil configuration managed to match with impedance at 13.56 MHz drive frequency is illustrated. This processing system includes a vacuum chamber 10 shaped like a hollow cylindrical body having a bottom 12, a side wall 14, and an upper flange 16 which defines an aperture 56 at the center thereof. Viewing windows 18 are formed on the side wall 14 so as to allow operators or plasma emission sensors to view the plasma within the chamber 10. A dielectric window 20 spans the aperture of the flange 16 and is preferably made of a ceramic such as aluminum oxide or quartz. In order to allow gas to be injected uniformly into the plasma chamber 10, a gas inlet nozzle 22A is positioned at a center of the dielectric window 20 and a gas inlet ring 22B is provided at a perimeter of the flange 16. Sealing of these elements of the vacuum chamber 10 is provided by conventional gaskets (not shown).

A suitable gas that can be excited to a plasma is supplied to the interior of the chamber 10 from a gas source 24 via the gas inlet nozzle 22A and the gas inlet ring 22B. The interior of the chamber 10 is maintained in a subatmospheric pressure condition at a pressure that can vary within a range of 0.01–100 milliTorr by using a turbo-molecular pump (not shown) connected to a port 26 provided at the bottom 12. The gas in the vacuum chamber 10 is excited to a plasma by a suitable electric source. The electric source includes a RF source 28, a matching network 30 and an induction coil configuration 32 on the dielectric window 20, which may be one of those shown in FIG. 1A, FIG. 1B, FIG. 3A, FIG. 3B and FIG. 3C consisting of four individual 3-inch-diam substantially helical coil portions. Each of the coil portions made of two turns of ⅜ inch-diam copper tube. The distance between the centers of two adjacent helical coil portions is approximately 4 ½ inches for processing an 8 inches wafer. As discussed previously, more than one induction coil configuration can be used together to provide a uniform plasma ion density for a larger wafer treatment. As for an induction coil shown as in FIG. 3C, two RF sources are needed.

The induction coil configuration 32 is excited by the RF source 28 via the matching network 30 that is resonant to the frequency of the RF source 28. The matching network 30 includes output terminals 34 and 36, one of which 34 is electrically connected to the coil 32 via a line 38, the other 36 is electrically connected to the coil 32 via a line 40 and grounded. The matching network is designed to substantially eliminate the reflection of RF power back to RF source 28. Typically, the RF source 28 has one of the ISM (Industry, Scientific, Medical) standard frequencies 13.56 MHz, 27.12 MHz or 40.68 MHz.

A wafer support assembly is disposed generally at the center within the chamber 10 and underneath the dielectric window 20, which includes a supporting rod 42 and a supporting platform 44 on the top of the supporting rod 42. The supporting rod 42 includes a ceramic isolation 46 at a middle point thereof, and it extends through the bottom 12 via an appropriate vacuum seal (not shown). The supporting platform 44 may be protected by an RF shield 48, on which a wafer 50 to be treated is supported. The wafer 50, having a major upper surface, is disposed at a distance D, in the range of 5–10 cm, from the dielectric window 20. The supporting platform 44, which serves as an RF bias electrode, is connected to an RF source 52. The chamber side wall 14 is connected to ground. The RF source 52 is preferably at one of the ISM standard frequencies (i.e., 13.56 MHz, 27.12 MHz or 40.68 MHz). As in the embodiment of FIG. 5, the RF sources 28 and 52 are all of the industry standard frequency of 13.56 MHz. It is apparent that other frequencies from kHz to MHz can also be used. Cooling of the supporting platform 44 is provided through coolant jackets (not shown). A cylindrical magnetic shield frame 54, preferably made of aluminum, is set atop the flange 16 surrounding the induction coil configuration 32 so as to confine and concentrate magnetic field lines resulting from current flowing through the induction coil configuration 32.

Figure 6A:
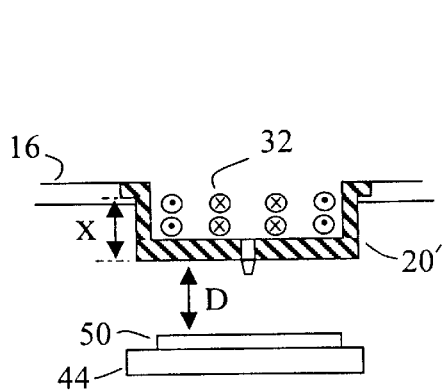
FIG. 6A is a partial cross-sectional view of a plasma reactor of the present invention employing a dish-shaped dielectric window.

An RF induction plasma using an induction coil configuration of plural helical coil portions with a dish-shaped ceramic dielectric according to one aspect of the present invention is shown in FIG. 6A, in which like elements and parts as shown in FIG. 5 are represented by like numerals. The dielectric window 20' spans the aperture of the flange 16, and the bottom of the dielectric window 20' extends toward the wafer 50 with a depth x from the flange 16, where 0<x<10 cm. Preferably, the depth x ranges from 0 cm to 5 cm. Compared to the apparatus described by Jacob in U.S. Pat. No. 3,705,091, the dielectric window 20' reduces the effect of capacitive coupling between the helical coil portions and the vessel walls, thus mitigate the contamination problem from the vessel walls to some extent. The distance between the dielectric window 20' and the wafer 50 as shown in FIG. 6A. can be easily adjusted by selecting a dish-shaped ceramic dielectric window having a different depth x. The apparatus shown in FIG. 6A is particularly suitable for using at very low pressure, preferably 0.01 to 1.0 miliTorr range, in which an RF induction plasma is prompted to approach the wafer surface. High flux of ionic species is yielded, and thus results in a rapid anisotropic etching.

At an intermediate pressure, in a range of 10 to 100 miliTorr, gas phase collisions of electrons, ions, and neutrons in the plasma prevent a substantial diffusion of the plasma charged particles outside of the annular region. As a result there is a relatively high plasma flux in the ring like region of the wafer but low plasma fluxes in the center and peripheral portions of the wafer. As described in the Background Art, one technique for solving the problem of plasma generation uniformity in a chamber is to raise its ceiling to a height greater than 10 cm. But while this does improve the uniformity of plasma distribution, it so increases the chamber volume and diffusion distance to the wafer as to remove the advantage of a small volume chamber. This seemingly intractable problem of non-uniform distribution of reactive species can be solved in another embodiment of the present invention shown in FIG. 6B.

Figure 6B:
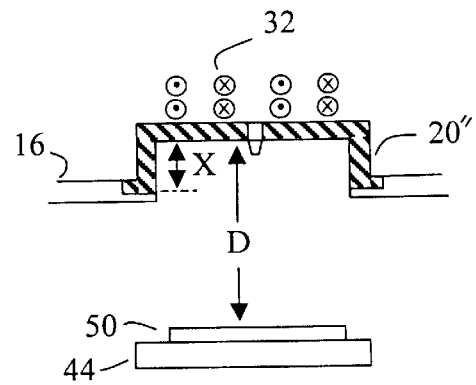
FIG. 6B is a partial cross-sectional view of a plasma reactor of the present invention employing a hat-shaped dielectric.

Contrary to the dish-shaped dielectric window 20' shown in FIG. 6A, a hat-shaped dielectric window 20'' is used in the embodiment shown in FIG. 6B. In FIG. 6B the elements and parts which are similar to those in FIG. 6A are designated by the same numerals. The hat-shaped dielectric window 20'' spans the aperture of the flange 16, and the top thereof protrude from the aperture of the flange 16 with a height x ranging from 0 to 10 cm, so as to increase the distance between the coil configuration 32 and the wafer 50 with a value x. In accordance with the embodiment of the present invention, the dielectric window 20'' provides a means to improve the uniformity of the plasma density without increasing the chamber volume much, and to approach optimal uniformity across the wafer surface.

Figure 7:
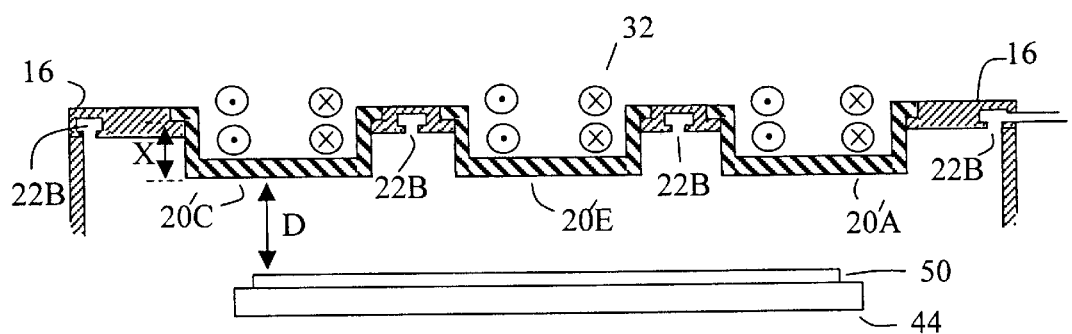
FIG. 7 is a partial cross-sectional view of a plasma reactor of the present invention employing plural induction coils received in plural dish-shaped dielectric windows, each of which is put into one of the dish-shaped dielectric windows.
Figure 8:
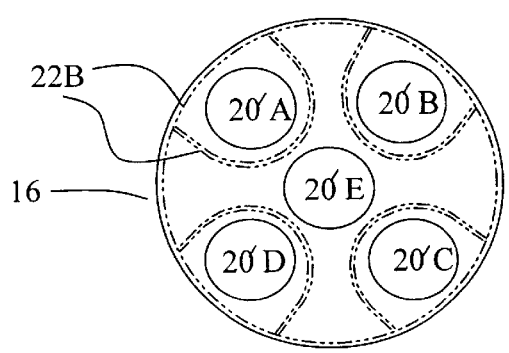
FIG. 8 is a top view of plural dielectric windows shown in FIG. 7.

An inductively coupled plasma reactor according to a further embodiment of the present invention is shown in FIGS. 7 and 8, which comprises plural dielectric windows 20'A to 20'E, each of which has a planar base and an integrally formed upright wall surrounding the planar base. This reactor provides a method of adjusting etch rate precisely by controlling the power of bias for processing a wafer with large surface area, for example a 12-inch wafer. In FIG. 7 the elements and parts which are similar to those in FIG. 5 are designated by the same numerals. The plural dielectric windows 20'A to 20'E in the plasma reactor are used to replace the single thick large dielectric window 20' in FIG. 6A to facilitate easy handling and cleaning, and to provide more effective coupling of the RF field through the dielectric windows to the plasma. An induction coil configuration 32 similar to that shown in FIG. 3A is used in this embodiment; however, the number of the helical coil portions thereof is five corresponding to the number of the dielectric windows. The five dish-shaped dielectric windows span 20'A to 20'E the apertures in the flange 16 made of a non-magnetic metal, such as anodized aluminum. The bottom of the dielectric windows 20'A–20'E extend toward the wafer 50 with a depth of x from the flange 16, wherein 0<x <10 cm. Preferably, the depth x ranges from 0 cm to 5 cm. Reactant gases that can be excited to a plasma is supplied to the interior of the chamber 10 through the gas inlets 22B shown as the dash lines in FIG. 8. The gas inlets 22B are provided at the perimeter of the flange 16 and at positions between the dielectric windows for producing uniform gas distribution. This apparatus can be used to generate a highly dense and uniform RF plasma closer to the wafer surface at a low pressure, to provide a means for adjusting etch rate precisely by controlling RF bias for processing a wafer with large surface area.

Figure 9:
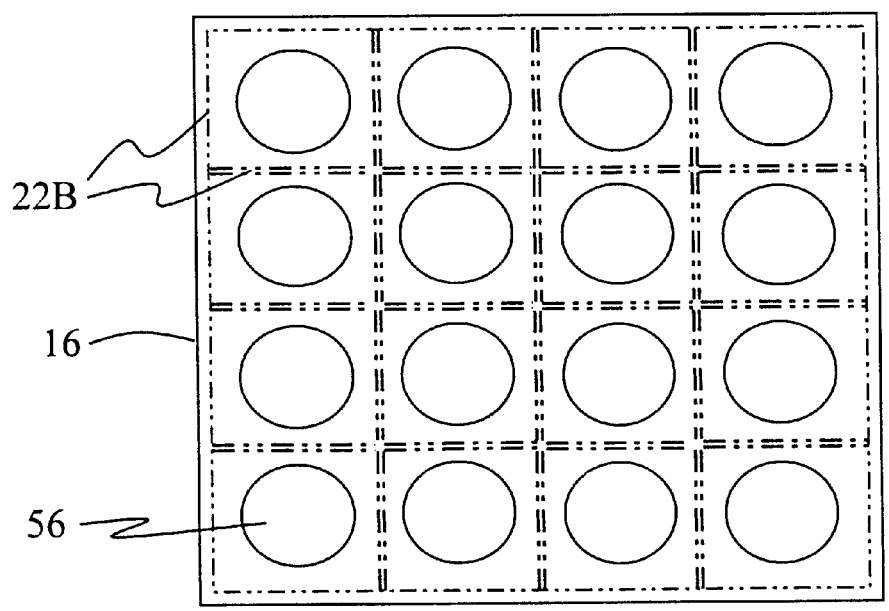
FIG. 9 is a top view of a flange for mounting thereto plural dielectric windows of a very large plasma reactor according to the teachings of the present invention.

It is understood that one can tailor the inductance by configuring multiple inductors in series, or in parallel, or the combination of both. With this concept in mind, one can constructs a very large plasma chamber by using arrays of induction coils having a desirable size and number of turns. FIG. 9 shows a flange having a specific gas inlet pattern to be used in a plasma reactor suitable for processing a very large surface substrate, such as a flat panel display substrate, and for simultaneously processing multiple substrates, to name a few.

While the present invention has been described with respect to specific embodiments, numerous changes, modifications and improvements falling within the scope and spirit of the invention will occur to those skilled in the art.

What is claimed is:

1. An inductively coupled plasma reactor comprising a chamber comprising a bottom plate, an upright side wall surrounding the bottom, and a flange hermetically connected to a free end of the upright side wall, wherein the flange has n apertures above the bottom plate, wherein n is an integer not less than 2;

n dielectric windows which hermetically seals said n apertures of the flange to provide a plasma generation space confined by the dielectric window and the chamber, wherein n is defined as above; and n helical coils which are separately and uprightly disposed on said n dielectric windows with longitudinal axes of the n helical coils being parallel with one another, wherein n is an integer not less than 2, wherein n is defined as above; wherein said n helical coils are connected in series with an end of the resulting n helical coils connected in series being grounded and another end thereof being adapted to connect to a RF power source; or said n helical coils are connected in parallel with one ends of the n helical coils being grounded and another ends thereof being connected to m node, and said m nodes are adapted to connected to one or more RF power sources, wherein m is an integer less than n and greater than 0; and wherein each one of said n dielectric windows has a planar base and an integrally formed upright wall surrounding the planar base, wherein a free end of the upright wall of the dielectric window is hermetically connected to said flange so that the planar base of the dielectric window protrudes from a corresponding aperture of said n apertures of the flange of the chamber, or so that the planar base of the dielectric window protrudes into a corresponding aperture of said n apertures of the flange of the chamber, wherein said n helical coils are uprightly disposed on the planar bases of said n dielectric windows, wherein said flange has a plurality of first gas inlet holes at its edge, and a plurality of second gas inlet holes between said n apertures.

2. The inductively coupled plasma reactor according to claim 1, wherein said n helical coils are connected in series, and each two helical coils adjacent to each other thereof have a same winding direction.

3. The inductively coupled plasma reactor according to claim 1, wherein said n helical coils are connected in series, and each two helical coils adjacent to each other thereof have two opposite winding directions.

4. The inductively coupled plasma reactor according to claim 2, wherein n=4.

5. The inductively coupled plasma reactor according to claim 1, wherein n=4.

6. The inductively coupled plasma reactor according to claim 1, wherein said n helical coils are connected in parallel, and each two helical coils adjacent to each other thereof have a same winding direction.

7. The inductively coupled plasma reactor according to claim 1, wherein said n helical coils are connected in parallel, and each two helical coils adjacent to each other thereof have two opposite winding directions.

8. The inducitivity coupled plasma reactor according to claim 1, wherein said n helical coils comprises a plurality of pairs of helical coils, wherein one ends of said plurality of pairs of helical coils are grounded, and another ends thereof are connected to one of more nodes of said m nodes.

9. The inductively coupled plasma reactor according to claim 8, wherein said another ends of said plurality of pairs of helical coils are connected to a common node (m=1.

10. The inductively coupled plasma reactor according to claim 8, wherein said another ends of said plurality of pairs of helical coils are connected to more than one nodes of said m nodes.

11. The inductively coupled plasma reactor according to claim 9, wherein n=4.

12. The inductively coupled plasma reactor according to claim 10, wherein n=4.

13. The inductively coupled plasma reactor according to claim 9, wherein n=5, wherein one end of a single helical coil is grounded and another end thereof is connected to said common node.

14. The inductively coupled plasma reactor according to claim 10, wherein n=5, wherein one end of a single helical coil is grounded and another end thereof is connected an additional node or one of said more than one nodes of said m nodes.

15. The inductively coupled plasma reactor according to claim 9, wherein n=16.

16. The inductively coupled plasma reactor according to claim 10, wherein n=16.

17. The inductively coupled plasma reactor according to claim 1, wherein said n helical coils have substantially a same dimension, wherein each of said helical coils is winding hollow copper tube having more than 1 turn, and wherein each of said helical coils has a diameter greater than 2 inches.

18. The inductively coupled plasma reactor according to claim 1, wherein said n dielectric windows are in the form of a plate.

19. The inductively coupled plasma reactor according to claim 1, wherein said n dielectric windows are cylindrical.

20. The inductively coupled plasma reactor according to claim 19, wherein the upright walls of said n dielectric windows have a height from the planar bases thereof less than 10 cm.

21. The inductively coupled plasma reactor according to claim 19, wherein the upright walls of said n dielectric windows have a height from the planar bases thereof less than 5 cm.

* * * * *